United States Patent
Staszewski et al.

(10) Patent No.: US 7,746,185 B2
(45) Date of Patent: Jun. 29, 2010

(54) APPARATUS AND METHOD FOR ACQUISITION AND TRACKING BANK COOPERATION IN A DIGITALLY CONTROLLED OSCILLATOR

(75) Inventors: Robert B. Staszewski, KJ Delft (NL); John Wallberg, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 72 days.

(21) Appl. No.: 11/551,103

(22) Filed: Oct. 19, 2006

(65) Prior Publication Data

US 2007/0085621 A1    Apr. 19, 2007

Related U.S. Application Data

(60) Provisional application No. 60/728,270, filed on Oct. 19, 2005.

(51) Int. Cl.
   *H03B 5/08* (2006.01)
   *H03C 3/22* (2006.01)
   *H03L 7/085* (2006.01)

(52) U.S. Cl. .................. 331/177 V; 331/16; 331/36 C; 375/376

(58) Field of Classification Search .................... 331/16, 331/36 C, 177 V; 375/376
   See application file for complete search history.

(56) References Cited

U.S. PATENT DOCUMENTS

| | | | |
|---|---|---|---|
| 6,150,891 A * | 11/2000 | Welland et al. | 331/25 |
| 2003/0133522 A1 | 7/2003 | Staszewski et al. | |
| 2004/0146132 A1 | 7/2004 | Staszewski et al. | |
| 2006/0033582 A1 | 2/2006 | Staszewski et al. | |
| 2006/0038710 A1 * | 2/2006 | Staszewski et al. | 341/143 |
| 2006/0152292 A1 * | 7/2006 | Puma et al. | 331/36 C |

OTHER PUBLICATIONS

R. B. Staszewski et al., "All-Digital PLL and GSM/EDGE Transmitter in 90nm CMOS," IEEE International Solid-State Circuits Conference, Feb. 2005, pp. 316-217, 600.

R. B. Staszewski et al., "A Digitally Controlled Oscillator in a 90 nm Digital CMOS Process for Mobile Phones," IEEE Journal of Solid-State Circuits, vol. 40, No. 11, Nov. 2005, pp. 2203-2211.

(Continued)

*Primary Examiner*—Robert Pascal
*Assistant Examiner*—Levi Gannon
(74) *Attorney, Agent, or Firm*—Ronald O. Neerings; Wade James Brady, III; Frederick J. Telecky, Jr.

(57) ABSTRACT

A novel apparatus for and method of acquisition and tracking bank cooperation in a digitally controlled oscillator (DCO) within an all digital phase locked loop (ADPLL). The acquisition bits of the acquisition bank are used as an extension of the modulation range. The PLL and TX tuning data are broken up (i.e. apportioned) into acquisition components and tracking components. This permits the use of two different capacitor banks (i.e. the tracking and acquisition banks) for modulation rather than just a single capacitor bank as in the prior art schemes. Incorporating the tracking and acquisition bit varactors, the cooperation scheme of the present invention permits the re-centering of the tracking bank to handle natural frequency drift of the DCO and the widening of the modulation range.

14 Claims, 5 Drawing Sheets

OTHER PUBLICATIONS

R. B. Staszewski et al., "All-Digital PLL and Transmitter for Mobile Phones," IEEE Journal of Solid-State Circuits, vol. 40, No. 12, Dec. 2005, pp. 2469-2482.

C. H. Hung et al., "A Digitally Controlled Oscillator System for SAW-Less Transmitters in Cellular Handsets," IEEE Journal of Solid-State Circuits, vol. 41, No. 5, May 2006, pp. 1160-1170.

K. Muhammad et al., "The First Fully Integrated Quad-Band GSM/GPRS Receiver in a 90-nm Digital CMOS Process," IEEE Journal of Solid-State Circuits, vol. 41, No. 8, Aug. 2006, pp. 1772-1783.

Y. C. Ho et al. "Charge-Domain Signal Processing of Direct RF Sampling Mixer with Discrete-Time Filters in Bluetooth and GSM Receivers," EURASIP Journal on Wireless Communications and Networking, vol. 2006, Article 62905, pp. 1-14.

M. Nakai et al., "Dynamic Voltage and Frequency Management for a Low-Power Embedded Microprocessor," IEEE Journal of Solid-State Circuits, vol. 40, No. 18, Jan. 2006, pp. 28-35.

* cited by examiner

APPARATUS AND METHOD FOR ACQUISITION AND TRACKING BANK COOPERATION IN A DIGITALLY CONTROLLED OSCILLATOR

REFERENCE TO PRIORITY APPLICATION

This application claims priority under 35 U.S.C. § 119(e) to U.S. Provisional Application Ser. No. 60/728,270, filed Oct. 19, 2005, entitled "New ADPLL architecture for low-power cellular applications," incorporated herein by reference in its entirety.

FIELD OF THE INVENTION

The present invention relates to the field of communications and more particularly relates to an apparatus for and method of acquisition and tracking bank cooperation in a digitally controlled oscillator (DCO).

BACKGROUND OF THE INVENTION

In a digitally controlled oscillator (DCO) based RF frequency synthesizer, the frequency oscillation is typically set by switching on an appropriate number of varactors in the oscillator circuit. For frequency range coverage and frequency resolution purposes, the varactors are typically organized in one or more banks. For example, there may be separate banks for acquisition and tracking modes of operation of the synthesizer in addition to very coarse PVT varactor bank. For a desired output frequency, an appropriate command word is generated and applied to the varactor banks. In this example, the DCO command word is divided between acquisition bit and tracking bits.

Modulation of the data is typically achieved using tracking bank. Both the acquisition and tracking range, however, are of a finite width. If the input tuning word exceeds the range of the varactor banks, then the PLL loop within the frequency synthesizer becomes nonlinear and the output becomes corrupt. Thus, it is important that the DCO input tuning word never exceeds the available linear range of the varactor banks.

Drifting of the center frequency caused by temperature, etc. poses a problem if the drift causes the DCO to creep towards the limits of its tracking range. When the desired center frequency hits the limits of the dynamic range, the tracking bits can no longer track those frequencies resulting in loss of lock and modulation distortion. A similar result occurs if the modulation range is larger than the entire tracking range. This may occur in the implementation of wireless standards requiring very wideband modulation, e.g., WCDMA or Wireless LAN, wherein the required modulation range exceeds the tracking range.

SUMMARY OF THE INVENTION

The present invention overcomes the problems associated with the prior art by providing an apparatus for and method of acquisition (coarse frequency step) and tracking (finer frequency step) varactor bank cooperation in a digitally controlled oscillator (DCO) within an all digital phase locked loop (ADPLL). The acquisition varactors of the acquisition bank are used as an extension of the modulation range. The PLL and TX tuning data are broken up (or apportioned) into acquisition components and tracking components. This permits the use of two different capacitor banks (i.e. the tracking and acquisition banks) for modulation rather than just a single capacitor bank as in the prior art schemes.

By incorporating the tracking and acquisition bit varactors, the cooperation scheme of the present invention permits (1) the re-centering of the tracking bank to handle natural frequency drift of the DCO; and (2) the widening of the modulation range. These functions are split into two separate circuits because (1) the frequency drift is very slow which permits an infrequent response with only one acquisition varactor added or subtracted; and (2) the modulation range widening is instantaneous, i.e. it can have large jumps from one cycle to the next. It is noted that if the limits of the tracking tuning range were allowed to be reached, the response of the ADPLL would no longer be linear and resulting in huge distortion. Thus, the mechanism of the present invention prevents this from occurring.

To extend the DCO range to accommodate for voltage and temperature drifts, and to allow wide frequency modulation, the coarser-step acquisition bits are engaged by subtracting an equivalent number (generally fractional) of the tracking bank varactors. The varactor frequency step calibration is conveniently performed just before each burst with minimal overhead using dedicated hardware.

Using best analog layout practices, the varactor matching precision economically obtained, without multiple silicon iteration cycles, is limited to 8 or 9 bits. In order to extend the DCO frequency modulation range, the present invention provides a mechanism to employ cooperation between the tracking bank and acquisition bank varactors. It is recognized that their frequency step ratio is not expected to be an integer. This ratio, however, is precisely determined through digital techniques described infra. The mechanism adds or drops one acquisition bank (AB) varactor and determines how many tracking bank (TB) varactors are dropped or added by the PLL loop during the subsequent phase lock settling. In order not to be limited by the basic resolution of the TB step size, the oscillator tuning word, including the fractional part, is used instead.

Since the TB and AB varactors are made of the same MOS devices with different sizes, it is expected that their capacitance ratio will be invariant to temperature changes. Consequently, the AB-to-TB frequency step ratio, $\Delta f^A/\Delta f^T$, once determined in a factory setting for a particular unit, could be used throughout its lifetime. In other cases, it might need to be periodically calibrated.

There is thus provided in accordance with the invention, a method of cooperation between an acquisition varactor bank and tracking varactor bank in a digitally controller oscillator (DCO), the method comprising the steps of comparing a phase locked loop (PLL) tuning word to a threshold and if the PLL tuning word exceeds the threshold then apportioning bits of the PLL tuning word between tracking PLL tuning and acquisition PLL tuning such that both the acquisition varactor bank and the tracking varactor bank contribute to the PLL tuning.

There is also provided in accordance with the invention, a method of cooperation between an acquisition varactor bank and tracking varactor bank in a digitally controller oscillator (DCO), the method comprising the steps of comparing a TX tuning word to a threshold and if the TX tuning word exceeds the threshold then apportioning bits of the TX tuning word between tracking TX tuning and acquisition TX tuning such that both the acquisition varactor bank and the tracking varactor bank contribute to the TX tuning.

There is further provided in accordance with the invention, an apparatus for cooperation between an acquisition varactor bank and a tracking varactor bank in a digitally controller oscillator (DCO) comprising re-centering means operative to apportion bits of a PLL tuning word between tracking PLL tuning and acquisition PLL tuning in response to slow drift of the DCO center frequency such that both the acquisition varactor bank and the tracking varactor bank contribute to PLL tuning and modulation widening means operative to apportion bits of a TX tuning word between tracking TX tuning and acquisition TX tuning in response to sudden large jumps in DCO center frequency such that both the acquisition varactor bank and the tracking varactor bank contribute to TX tuning.

There is also provided in accordance with the invention, a method of cooperation between a plurality of banks of conversion devices in a digital to analog quantity converter (DAC) for converting an input word to the analog quantity, the method comprising the steps of comparing the input word to a threshold and if the input word exceeds the threshold then apportioning bits of the input word between the multiple banks such that the banks contribute to the conversion.

Note that some aspects of the invention described herein may be constructed as software objects that are executed in embedded devices as firmware, software objects that are executed as part of a software application on either an embedded or non-embedded computer system such as a central processing unit (CPU), digital signal processor (DSP), microcomputer, minicomputer, microprocessor, etc. running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

The following notation is used throughout this document.

| Term | Definition |
| --- | --- |
| AB | Acquisition Bank |
| ADPLL | All Digital Phase Locked Loop |
| ASIC | Application Specific Integrated Circuit |
| CDMA | Code Division Multiple Access |
| CMOS | Complementary Metal Oxide Semiconductor |
| CPU | Central Processing Unit |

-continued

| Term | Definition |
| --- | --- |
| CV | Current/Voltage |
| DCO | Digital Controlled Oscillator |
| DRP | Digital RF Processor or Digital Radio Processor |
| DSP | Digital Signal Processor |
| FCW | Frequency Command Word |
| FPGA | Field Programmable Gate Array |
| GSM | Global System for Mobile Communication |
| HB | High Band |
| HDL | Hardware Description Language |
| LB | Low Band |
| LO | Local Oscillator |
| PLL | Phase Locked Loop |
| PVT | Process, Voltage, Temperature |
| RF | Radio Frequency |
| TB | Tracking Bank |
| TDC | Time to Digital Converter |
| VCO | Voltage Controlled Oscillator |
| WCDMA | Wideband Code Division Multiple Access |

DESCRIPTION OF THE PRESENT INVENTION

The present invention is an apparatus for and method of acquisition (coarse frequency steps) and tracking (finer frequency steps) bank cooperation in a digitally controlled oscillator (DCO) within an all digital phase locked loop (ADPLL). The acquisition bits of the acquisition bank are used as an extension of the modulation range. The PLL and TX tuning data are broken up (i.e. apportioned) into acquisition components and tracking components. This permits the use of two different capacitor banks (i.e. the tracking and acquisition banks) for modulation rather than just a single capacitor bank as in the prior art schemes. Incorporating the tracking and acquisition bit varactors, the cooperation scheme of the present invention permits the re-centering of the tracking bank to handle natural frequency drift of the DCO and the widening of the modulation range.

Digital RF Processor (DRP) Transmitter

Figure 1:
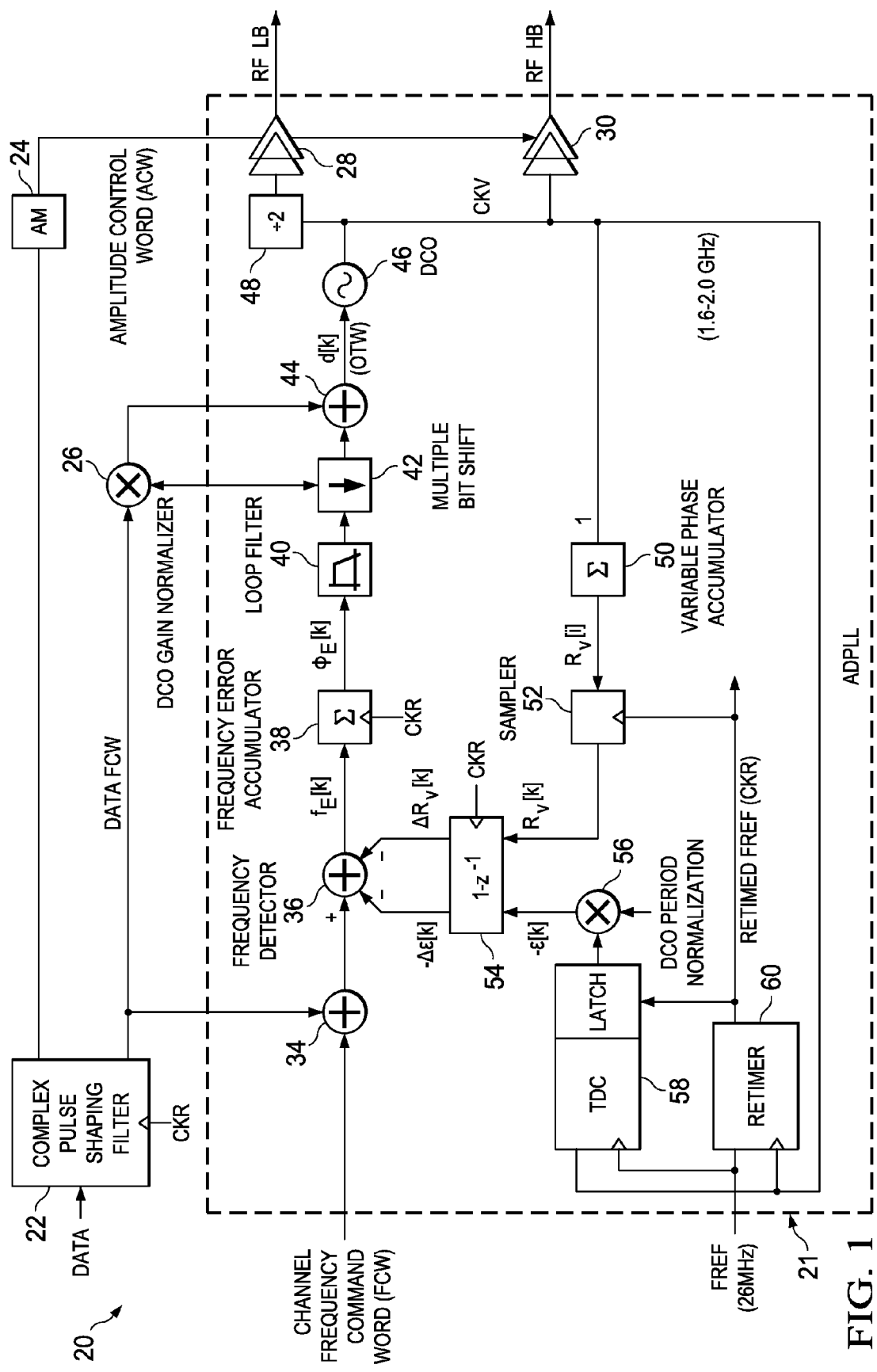
FIG. 1 is a block diagram illustrating a DRP transmitter based on an all digital PLL and incorporating the tracking and acquisition cooperation scheme of the present invention.

A block diagram illustrating a DRP transmitter based on an all digital PLL and incorporating the tracking and acquisition cooperation scheme of the present invention is shown in FIG. 1. The transmitter, generally referenced 20, comprises complex pulse shaping filter 22, amplitude modulation block 24, low and high band digital pre-power amplifiers 28, 30, respectively, and ADPLL 21. The transmitter is operative to perform quadrature modulation in the polar domain in addition to the generation of the local oscillator (LO) signal for the receiver. Almost all clocks in the system are derived directly from this source. Note that the transmitter is constructed using digital techniques that exploit the high speed and high density of the advanced CMOS, while avoiding problems related to voltage headroom. The ADPLL circuit 21 replaces a conventional RF synthesizer architecture (based on a voltage-controlled oscillator (VCO) and a phase/frequency detector and charge-pump combination), with a digitally controlled oscillator (DCO) system (containing the digital logic interface) 46 and a time-to-digital converter (TDC) system 58. All inputs and outputs are digital and some even at multi-GHz frequency.

The ADPLL 21 comprises adders 34, 44, frequency detector 36, frequency error accumulator 38, loop filter 40, coarse DCO gain normalizer 42, fine DCO gain normalizer 26, DCO 46, LB divider 48, variable phase accumulator 50, sampler 52, FREF retimer 60, TDC 58, variable phase differentiator 54 and TDC DCO-period normalizer 56.

Note that the clock input to the AM block may comprise CKR clock or CKV divided clock. The core of the ADPLL is a digitally controlled oscillator (DCO) adapted to generate the RF oscillator clock CKV. The oscillator core (not shown) operates at twice the 1.6-2.0 GHz high band (HB) frequency, which is then divided for precise generation of RX quadrature signals. The single DCO is shared between transmit and receive and is used for both the high frequency bands (HB) and the low frequency bands (LB). An additional 4-bits of the tracking bank varactors are dedicated for sigma-delta dithering in order to improve frequency resolution.

The DCO tuning capacitance is split into a large number of tiny capacitors that are selected digitally. Advanced lithography processes available today permit creation of extremely fine variable capacitors (i.e. varactors) at approximately 40 attofarads of capacitance per step, which equates to the control of only 250 electrons entering or leaving the resonating LC tank (not shown). Despite the small capacitance step, the resulting frequency step at the 2 GHz RF output is 10-20 kHz, which is too coarse for wireless applications. Thus, the fast switching capability of the transistors is utilized by performing programmable high-speed (225-900 MHz) dithering of the finest varactors. The duty cycle of the high/low capacitive states establishes the time-averaged resonating frequency resolution, now less than 1 kHz. All the varactors are realized as n-poly/n-well MOSCAP devices that operate in the flat regions of their CV curves.

The ADPLL operates in a digitally synchronous fixed-point phase domain but employs frequency detection rather than phase detection. The expected variable frequency $f_V$ is related to the reference frequency $f_R$ by the frequency command word (FCW) as follows.

$$FCW[k] \equiv \frac{E(f_V[k])}{f_R} \quad (1)$$

The FCW is time variant and is allowed to change with every cycle $T_R=1/f_R$ of the frequency reference clock. With $W_F=24$ fractional part word length of FCW, the ADPLL provides fine frequency control with 1.5 Hz accuracy, according to:

$$\Delta f_{res} = \frac{f_R}{2^{W_F}} \quad (2)$$

The number of integer bits $W_I=8$ was chosen to fully cover the GSM band frequency range of $f_V=1600$-$2000$ MHz with an arbitrary reference frequency $f_R \geq 8$ MHz.

The ADPLL sequencer traverses through the process, voltage, temperature (PVT) calibration and acquisition modes during channel selection and frequency locking and stays in the tracking mode during the transmission or reception of a burst. To extend the DCO range to accommodate for voltage and temperature drifts, and to allow wide frequency modulation, the coarser-step acquisition bits are engaged by subtracting an equivalent number (generally fractional) of the tracking bank varactors. The varactor frequency step calibration is performed just before each GSM burst with minimal overhead using dedicated hardware.

The variable phase $R_V[i]$ is determined by counting the number of rising clock transitions of the DCO oscillator clock CKV:

$$R_V[i] = \sum_{l=0}^{i} 1 \quad (3)$$

The index i indicates the DCO edge activity. The FREF sampled variable phase $R_V[k]$, where k is the index of the FREF activity edge activity, is fixed point concatenated with the normalized time-to-digital converter (TDC) output $\epsilon[k]$. The TDC measures and quantizes the time differences between the frequency reference (FREF) and the DCO clock edges. The sampled differentiated variable phase is subtracted from the frequency command word (FCW) by the digital frequency detector. The frequency error $f_E[k]$ samples $$f_E[k]=FCW-[(R_V[k]-\epsilon[k])-(R_V[k-1]-\epsilon[k-1])] \quad (4)$$

are accumulated (i.e. integrated back to phase) via frequency error accumulator 40 to create the phase error $\phi_E[k]$ samples $$\phi_E[k] = \sum_{l=0}^{k} f_E[k] \quad (5)$$

Acquisition and Tracking Tuning Range

Figure 2:
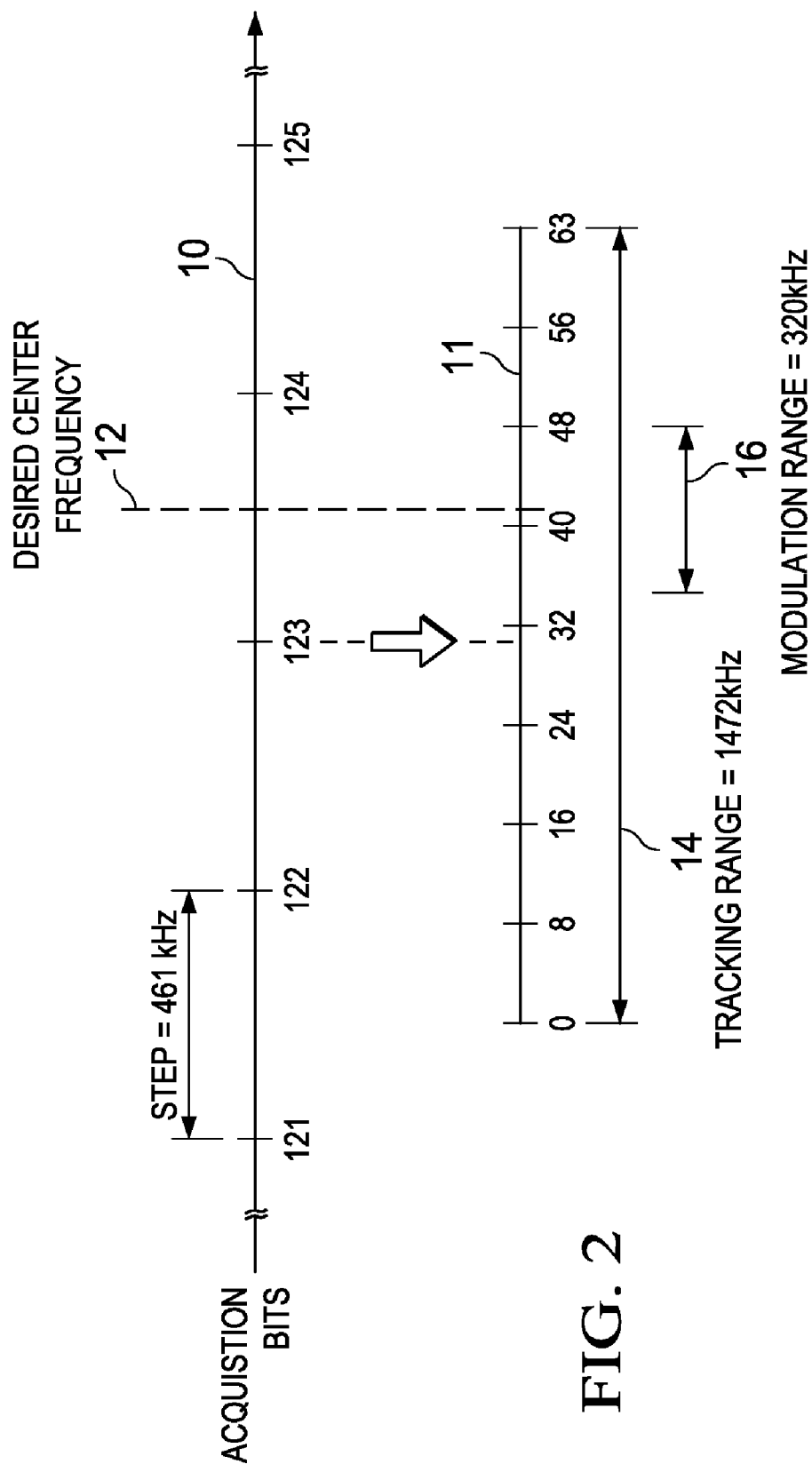
FIG. 2 is a diagram illustrating an example tuning range of tracking and acquisition banks for a Bluetooth case.

A diagram illustrating an example tuning range of tracking and acquisition banks is shown in FIG. 2. The frequency tuning of the DCO is accomplished by means of the quantized capacitance of an LC-based tank oscillator (not shown). There are three operational modes of the DCO:

Process/voltage/temperature (PVT)-calibration mode: This mode is active during cold power up and on an as-needed basis. It places the nominal frequency of the DCO in the middle of the desired modulation band (e.g., Bluetooth, GSM, WCDMA, etc.). It is also possible to use this mode on a regular basis as an ultra fast acquisition before the regular acquisition mode. It uses an 8-bit binary weighted encoding which is obtained by means of finger multiplicity of a unit-sized varactor. The frequency resolution $\Delta f^P=2316$ kHz for Bluetooth and 4 MHz for GSM.

Acquisition mode: This mode is active during channel select. It uses an 8-bit binary weighted encoding (referenced 10). For best matching, the binary weight is obtained by means of finger multiplicity of a unit-sized varactor. The frequency resolution $\Delta f^A=461$ kHz for Bluetooth and 200 kHz for GSM; frequency range $\Delta f_{max}^A=118$ MHz for Bluetooth and 12.8 MHz for GSM.

Tracking mode: This mode is active during the actual transmit and receive. It uses 64-bit unit-weighted encoding for the integer resolution (referenced 14) and 8-bit unit-weighted encoding for the fractional resolution. The frequency resolution $\Delta f^T=23$ kHz for Bluetooth and 12 kHz for GSM; frequency range $\Delta f_{max}^T=1.472$ MHz for Bluetooth and 1.5 MHz for GSM.

Cooperation Between Tracking and Acquisition Varactor Tuning Banks

Thus, the modulation is achieved using tracking bits. Horizontal line 10 in FIG. 2 denotes the acquisition bits and horizontal line 11 denotes the tracking bits. There are 64 tracking bits, which translates to a tracking range of 1472 kHz (referenced 14). The modulation range of Bluetooth, for example, is 320 kHz (referenced 16). Since the entire range of 320 kHz is within the tracking range of 1472 kHz, there is no problem in handling the entire Bluetooth modulation range within the tracking range.

A problem occurs when the DCO either starts drifting or attempts to implement a modulation scheme with very wideband modulation, e.g., WCDMA. Consider that the modulation range begins drifting because the oscillator center frequency drifts due to changes in temperature and that change can be swift in case of a GSM system, which contains a 2-Watt RF power amplifier. When the desired center frequency 12 hits the limits of the dynamic range, the tracking bits can no longer track those frequencies resulting in modulation distortion. A similar result occurs if the modulation range is bigger than the entire tracking range.

Therefore, in accordance with the invention, to overcome the limitation of the tracking range, the acquisition bits are used as an extension of the modulation range. For practical purposes, the frequency range of the acquisition range is nearly infinite (many times more than the tracking bank range, and could further be extended with the PVT varactors). Thus, this technique is used to implement wireless standards with large modulation ranges, e.g., WCDMA, which requires approximately 60 MHz of modulation range. Considering only the tracking bits, 1.4 MHz can be covered. Thus, the tracking bits alone would not be sufficient to handle WCDMA modulation. The combination of tracking and acquisition bits can, however, be used to handle the large modulation range of WCDMA.

Figure 3:
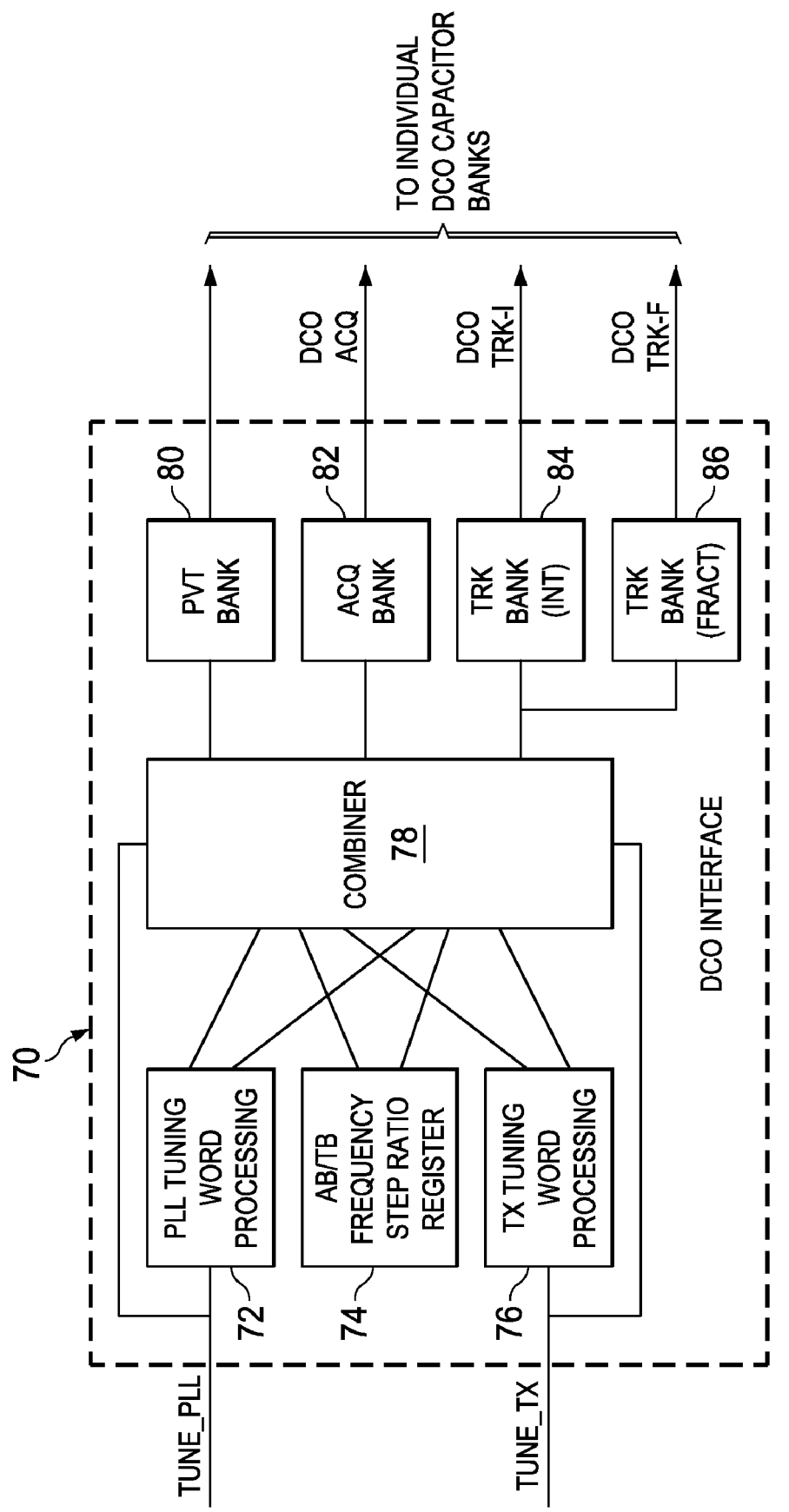
FIG. 3 is a block diagram illustrating an example embodiment of DCO interface of the present invention.

A block diagram illustrating an example embodiment of DCO interface of the present invention is shown in FIG. 3. The DCO interface, generally referenced 70, comprises a PLL tuning word processing block 72 adapted to receive and process a PLL tuning word, a TX tuning word processing block 76 adapted to receive and process a TX tuning word, an AB/TB frequency step ratio register 74, combiner block 78, PVT varactor bank driver interface 80, acquisition varactor bank interface 82, integer tracking varactor bank interface 84 and fractional tracking varactor bank interface 86.

The DCO interface circuit 70 functions as the driver block which receives its inputs from the loop filter (TUNE_PLL) and TX modulation blocks (TUNE_TX) and converts these signals into control for the individual DCO capacitor banks. In PVT and acquisition mode, the PLL tuning word directly drives the DCO capacitor banks. In tracking mode, the TX tuning word is added to the PLL tuning word to drive the DCO tracking bank. While in tracking mode, the DCO also has the capability, in accordance with the mechanism of the present invention, of updating the DCO acquisition value either via re-centering or wideband modulation.

Figure 4:
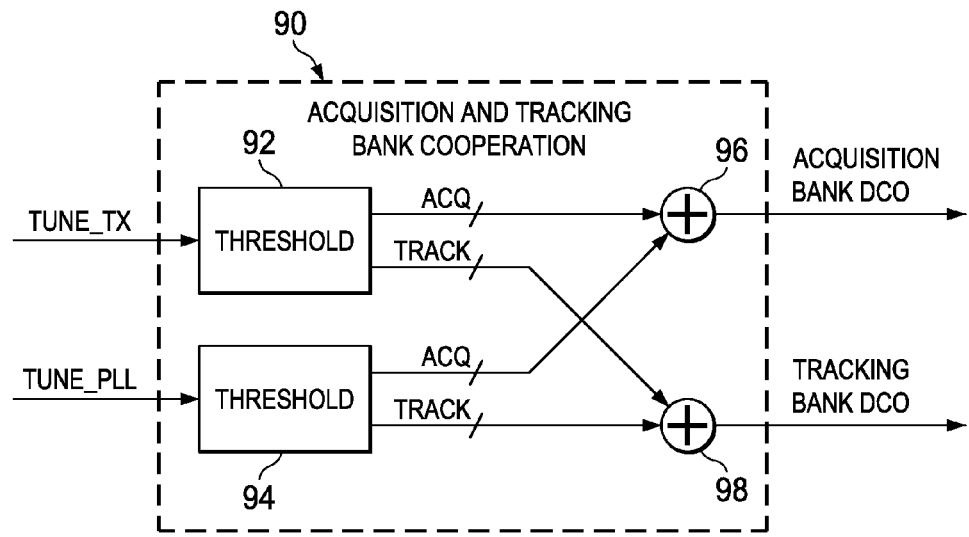
FIG. 4 is a block diagram illustrating the two methods of cooperation of the acquisition and tracking varactor banks in accordance with the present invention.

A block diagram illustrating the cooperation of the acquisition and tracking varactor banks in accordance with the present invention is shown in FIG. 4. The acquisition and tracking bank cooperation circuit, generally referenced 90, comprises a first threshold processing block 92, second threshold processing block 94 and adders 96, 98.

In operation, the circuit 90 receives its inputs from the loop filter (TUNE_PLL) and TX modulation blocks (TUNE_TX) and converts these signals into acquisition bank DCO and tracking bank DCO control signals. Threshold processing block 92 compares the TX tuning word to a threshold and if it exceeds the threshold, some of the new varactors of the acquisition bank are used in addition to the tracking bank varactors. Thus, the bits of the input TX tuning word are apportioned or divided in a certain manner between the acquisition and tracking banks.

Similarly, threshold processing block 94 compares the PLL tuning word to a threshold and if it exceeds the threshold, some of the varactors of the new acquisition bank are added or subtracted in addition to the tracking bank varactors. Thus, the bits of the input PLL tuning word are apportioned or divided in a certain manner between the acquisition and tracking banks.

The acquisition bits output from both threshold blocks are combined via combiner 96 and output to the acquisition DCO bank. Similarly, the tracking bits output from both threshold blocks are combined via combiner 98 and output to the tracking DCO bank. Note that the modulation threshold processing block outputs zero in the PVT and acquisition intervals of the PLL settling.

Thus, the tuning data being transferred enters circuit 90 which functions to break it up into acquisition components and tracking components. It permits the use of two different capacitor banks (i.e. the tracking and acquisition banks) for modulation rather than just a single capacitor bank as in the prior art schemes.

Therefore by incorporating the tracking and acquisition bit varactors, the cooperation scheme of the present invention permits (1) the re-centering of the tracking bank to handle natural frequency drift of the DCO; and (2) the widening of the modulation range. These functions are split into two separate circuits because (1) the frequency drift is very slow which permits a specific response with hysteresis; and (2) the modulation range widening is instantaneous, i.e. it can have large jumps from one cycle to the next—in this case the hysteresis is not desired. It is noted that if the limits of the tracking tuning range were allowed to be reached, the response of the ADPLL would no longer be linear and resulting in huge distortion. Thus, the mechanism of the present invention prevents this from occurring.

Re-Centering of PLL Tuning

Figure 5:
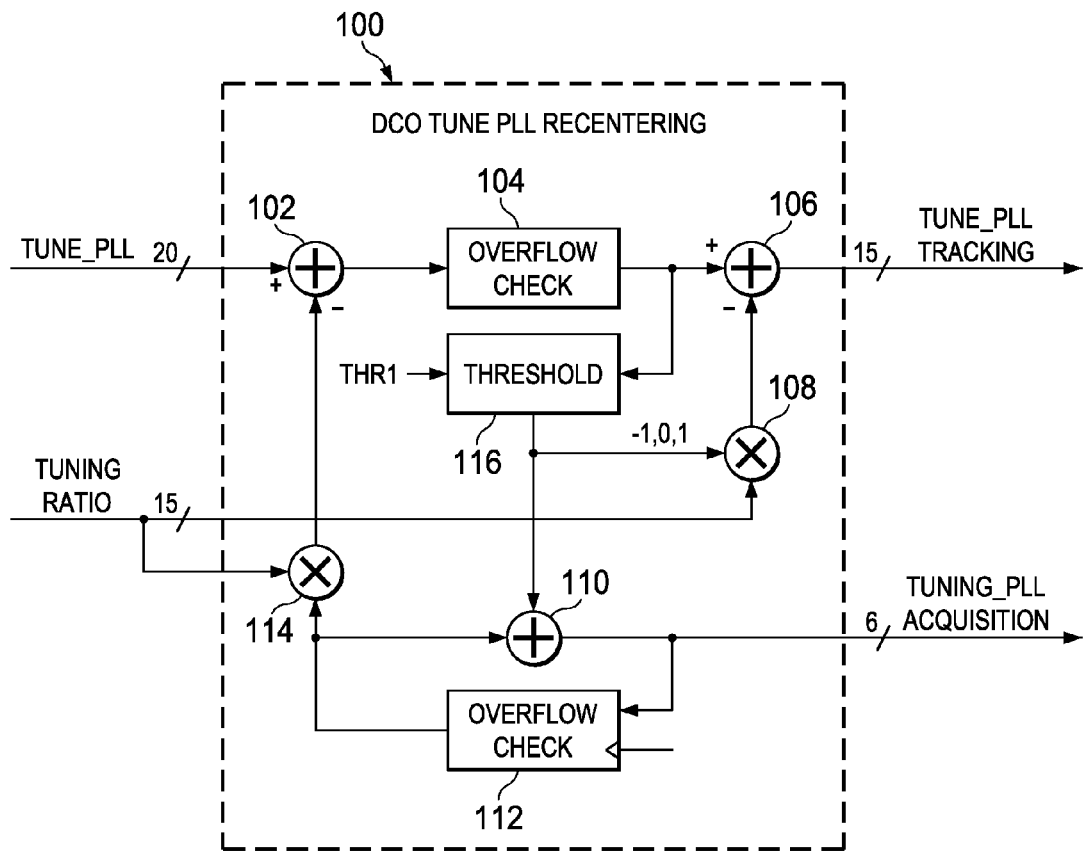
FIG. 5 is a block diagram illustrating the DCO PLL tuning re-centering mechanism of the present invention.

A block diagram illustrating the DCO PLL tuning re-centering mechanism of the present invention is shown in FIG. 5. The DCO PLL tuning re-centering circuit, generally referenced 100, comprises overflow check blocks 104, 112, adders 102, 106, 110, threshold block 116 and multipliers 108, 114.

In operation, during tracking mode, the PLL portion of the signed 2's complement DCO tuning word enters the circuit 100 which functions to break the input word up into a TB component and an AB component. Acquisition capacitors are used so as to maintain the tracking bank close to zero and to enable handling of relatively slow changes of the DCO center frequency (i.e. DCO drift), the combination of both functions referred to as 're-centering.'

Assuming the output of the multiplier is initially zero, the PLL tuning word enters the threshold block 116 which is operative to compare it to a threshold THR1 and −THR1. The threshold is preferably set to a value less (but not much less) than the tuning ratio. The output of the threshold block is −1 if the PLL tuning word exceeds the negative value of the threshold (assuming a 2's complement representation of frequency range from negative to positive frequency); 0 if the PLL tuning word is within the threshold range; and 1 if the PLL tuning word exceeds the positive threshold. This output value is then multiplied by the tuning ratio and the product is subtracted from the input tuning range via adder 106 to generate a re-centered tracking PLL tuning word.

In addition, the output of block 116 is accumulated via the combination of adder 110 and clocked overflow check 112 in order to achieve the desired hysteresis function. The current accumulated threshold results are output as the acquisition PLL tuning output. The accumulated acquisition tuning is also (with one clock cycle delay) multiplied by the tuning ratio, via multiplier 114, and subtracted from the input PLL tuning word via adder 102. This prevents large jumps in subsequent input PLL tuning words. Thus, from one clock cycle to another, the acquisition PLL tuning can only be incremented or decremented by one bit. This assumes the PLL tuning only undergoes slow drift in center frequency.

Modulation Range Widening of Tracking Range

Figure 6:
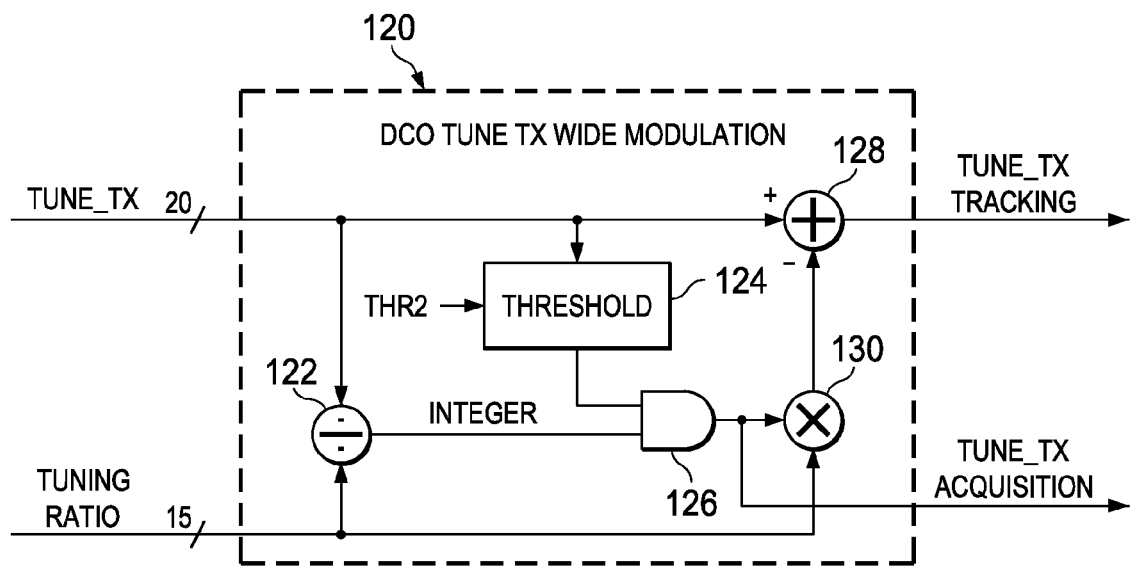
FIG. 6 is a block diagram illustrating the DCO TX modulation widening mechanism of the present invention.

A block diagram illustrating the DCO TX modulation widening mechanism of the present invention is shown in FIG. 6. The DCO TX tuning wide modulation circuit, generally referenced 120, comprises a divider 122, adder 128, threshold block 124, gating function 126 and multiplier 130.

The operation of the circuit 120, on the other hand, is adapted to handle large sudden jumps in the modulation range. During the tracking mode, the TX portion of the DCO tuning word enters the circuit 120 which functions to break the input TX tuning word into a tracking component and an acquisition component. The use of acquisition capacitors in addition to tracking capacitors for modulation allows for significantly wider modulation range. Note that the TX tuning word is handled differently than the PLL tuning word because its change can be quite extreme.

The TX tuning word is input to the divider 122, threshold block 124 and adder 128. The divider functions to generate the integer portion of the quotient of the TX tuning word and the AB/TB tuning ratio (i.e. the number of TB varactors per one AB varactor). This eventually becomes the acquisition TX tuning bits if enabled by the gate 126. The threshold block compares the TX tuning word to both a positive and negative value of the threshold THR2 (preferably configured to a value less than the tuning ratio). If it exceeds this threshold, then the integer division results output as the acquisition TX tuning output. The remainder of the division is output as the tracking TX tuning output. The remainder is generated by subtracting the product of the tuning ratio and the integer result from the original input TX tuning word.

Tuning Ratio Calibration

Figure 7:
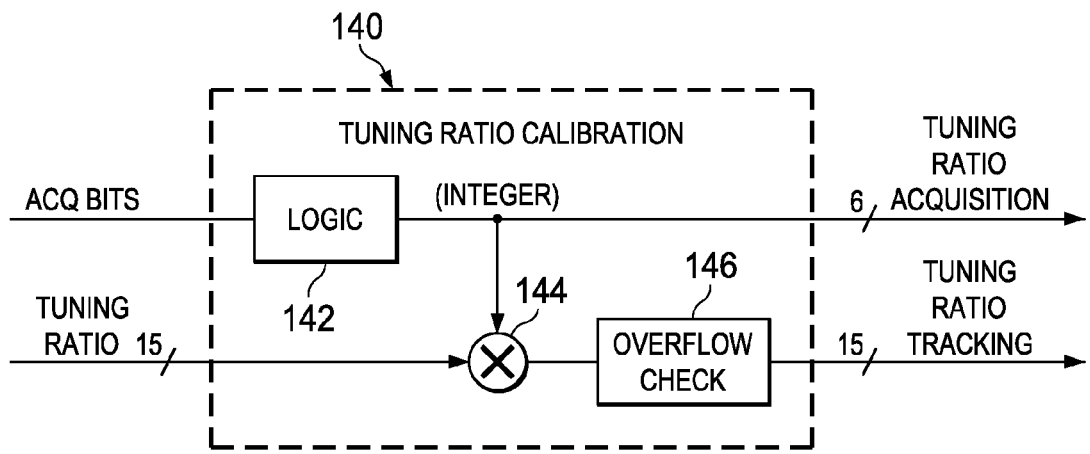
FIG. 7 is a block diagram illustrating the tuning ratio calibration technique of the present invention.

A block diagram illustrating the tuning ratio calibration technique of the present invention is shown in FIG. 7. The tuning ratio calibration circuit, generally referenced 140, comprises digital logic block 142, multiplier 144 and overflow check 146. The calibration circuit 140 is used to calibrate the ratio between the number of tracking capacitors per acquisition capacitor (referred to as the tuning ratio).

To perform calibration, a positive step of one acquisition bit (i.e. one acquisition capacitor) is applied. The ADPLL loop is then allowed to settle. Applying a positive step of one acquisition bit should cause the tracking bank to settle at a negative value to compensate. The loop removes any additional error. The amount of the negative step is used to calculate the tuning ratio. To shorten the ADPLL settling time, the initially estimated number of TB varactors could be engaged at the same time with the AB varactor step. The ADPLL loop will then settle with the difference of the total number of TB varactors.

It should be noted that the methods and techniques presented herein apply to a general class of a digital-to-analog converter (DAC), where the 'A' in 'DAC' denotes any analog quantity (voltage, current, resistance, capacitance, frequency, power, etc). The digitally-controlled conversion devices could also be arranged using similar philosophy of using several banks, in which each bank consists of a number of the unit-weighted devices. Between the banks, however, the device size could be different. Some additional banks could be encoded in non-unit-weighted manner, such as binary encoding. In the embodiments described supra, the analog quantity ('A' in 'DAC') is capacitance, which gets further converted into frequency deviation through the LC resonating tank-based oscillator. The conversion device is a varactor. The banks are acquisition varactor bank and tracking varactor banks, each comprising the same-size devices.

In alternative embodiments, the methods of the present invention may be applicable to implementations of the invention in integrated circuits, field programmable gate arrays (FPGAs), chip sets or application specific integrated circuits (ASICs), DSP circuits, wired or wireless implementations and other communication system products.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of cooperation between an acquisition varactor bank and tracking varactor bank in a digitally controller oscillator (DCO), said method comprising the steps of:
   comparing a phase locked loop (PLL) tuning word to a threshold; and
   if said PLL tuning word exceeds said threshold then apportioning bits of said PLL tuning word between tracking PLL tuning and acquisition PLL tuning such that both said acquisition varactor bank and said tracking varactor bank contribute to the PLL tuning.

2. The method according to claim 1, wherein said tracking PLL tuning is maintained as close to zero as possible.

3. The method according to claim 1, wherein said step of apportioning comprises the step of re-centering said tracking PLL tuning.

4. The method according to claim 1, wherein said step of apportioning is adapted to respond to slow drifting of DCO center frequency.

5. The method according to claim 1, wherein said step of apportioning comprises either incrementing, decrementing or not changing the acquisition PLL tuning each clock cycle.

6. A method of cooperation between an acquisition varactor bank and tracking varactor bank in a digitally controller oscillator (DCO), said method comprising the steps of:
   comparing a phase locked loop (PLL) tuning word to a threshold set to a first threshold at the beginning of a packet and to a second threshold for a remainder of said packet; and
   if said PLL tuning word exceeds said threshold then apportioning bits of said PLL tuning word between tracking PLL tuning and acquisition PLL tuning such that both said acquisition varactor bank and said tracking varactor bank contribute to the PLL tuning.

7. A method of cooperation between an acquisition varactor bank and tracking varactor bank in a digitally controller oscillator (DCO), said method comprising the steps of:
   comparing a TX tuning word to a threshold; and
   if said TX tuning word exceeds said threshold then apportioning bits of said TX tuning word between tracking TX tuning and acquisition TX tuning such that both said acquisition varactor bank and said tracking varactor bank contribute to the TX tuning.

8. The method according to claim 7, wherein said step of apportioning comprises the step of widening the modulation range of said tracking TX tuning.

9. The method according to claim 7, wherein said step of apportioning is adapted to respond to requests for sudden large changes in DCO center frequency.

10. A method of cooperation between an acquisition varactor bank and tracking varactor bank in a digitally controller oscillator (DCO), said method comprising the steps of:
  comparing a TX tuning word to a threshold set to a first threshold at the beginning of a packet and to a second threshold for a remainder of said packet; and
  if said TX tuning word exceeds said threshold then apportioning bits of said TX tuning word between tracking TX tuning and acquisition TX tuning such that both said acquisition varactor bank and said tracking varactor bank contribute to the TX tuning.

11. A method of cooperation between an acquisition varactor bank and tracking varactor bank in a digitally controller oscillator (DCO), said method comprising the steps of:
  comparing a TX tuning word to a threshold; and
  if said TX tuning word exceeds said threshold then apportioning bits of said TX tuning word between tracking TX tuning and acquisition TX tuning such that both said acquisition varactor bank and said tracking varactor bank contribute to the TX tuning, wherein said step of apportioning comprises the step of increasing acquisition TX tuning by multiples of a tuning ratio within a clock cycle.

12. An apparatus for cooperation between an acquisition varactor bank and a tracking varactor bank in a digitally controller oscillator (DCO), comprising:
  re-centering means operative to apportion bits of a PLL tuning word between tracking PLL tuning and acquisition PLL tuning in response to slow drift of said DCO center frequency such that both said acquisition varactor bank and said tracking varactor bank contribute to PLL tuning; and
  modulation widening means operative to apportion bits of a TX tuning word between tracking TX tuning and acquisition TX tuning in response to sudden large jumps in DCO center frequency such that both said acquisition varactor bank and said tracking varactor bank contribute to TX tuning, wherein said modulation widening means comprises:
    means for comparing said TX tuning word to a threshold;
    means for generating said acquisition TX tuning as the integer result of the division of said TX tuning word by a tuning ratio if said TX tuning word exceeds said threshold; and
    means for generating said tracking TX tuning as the remainder result of the division of said TX tuning word by a tuning ratio if said TX tuning word exceeds said threshold.

13. An apparatus for cooperation between an acquisition varactor bank and a tracking varactor bank in a digitally controller oscillator (DCO), comprising:
  re-centering means operative to apportion bits of a PLL tuning word between tracking PLL tuning and acquisition PLL tuning in response to slow drift of said DCO center frequency such that both said acquisition varactor bank and said tracking varactor bank contribute to PLL tuning;
  modulation widening means operative to apportion bits of a TX tuning word between tracking TX tuning and acquisition TX tuning in response to sudden large jumps in DCO center frequency such that both said acquisition varactor bank and said tracking varactor bank contribute to TX tuning; and
  means for calibrating a tuning ratio as the ratio between tracking varactors per acquisition varactor.

14. A method of cooperation between a plurality of banks of conversion devices in a digital to analog quantity converter (DAC) for converting an input word to said analog quantity, said method comprising the steps of:
  comparing said input word to a threshold; and
  if said input word exceeds said threshold then apportioning bits of said input word between said plurality of banks such that said banks contribute to said conversion.

* * * * *